United States Patent
Jones et al.

(10) Patent No.: US 9,583,216 B2
(45) Date of Patent: Feb. 28, 2017

(54) MBIST DEVICE FOR USE WITH ECC-PROTECTED MEMORIES

(71) Applicant: ANALOG DEVICES, INC., Norwood, MA (US)

(72) Inventors: Eric C. Jones, North Attleboro, MA (US); Andrew J. Allan, Wrentham, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 24 days.

(21) Appl. No.: 14/656,966

(22) Filed: Mar. 13, 2015

(65) Prior Publication Data

US 2016/0268007 A1    Sep. 15, 2016

(51) Int. Cl.
*G11C 29/42* (2006.01)
*G11C 29/36* (2006.01)

(52) U.S. Cl.
CPC .............. *G11C 29/42* (2013.01); *G11C 29/36* (2013.01)

(58) Field of Classification Search
CPC ......... G11C 29/42; G11C 29/36; G11C 29/12; G11C 29/14
USPC ........................................ 714/718
See application file for complete search history.

(56) References Cited

U.S. PATENT DOCUMENTS

| | | | | |
|---|---|---|---|---|
| 5,502,732 A * | 3/1996 | Arroyo | ............... | G06F 11/2215 714/703 |
| 7,308,621 B2 | 12/2007 | Adams et al. | | |
| 8,103,930 B2 * | 1/2012 | Barrett | ................... | G06F 11/10 714/753 |
| 2005/0204234 A1 | 9/2005 | Bacigalupo | | |
| 2008/0126911 A1 * | 5/2008 | Brittain | ............ | G01R 31/31712 714/763 |
| 2009/0049350 A1 * | 2/2009 | Parris | ..................... | G11C 29/02 714/720 |
| 2010/0162056 A1 * | 6/2010 | Higashino | ........... | G06F 11/1048 714/718 |
| 2011/0035637 A1 | 2/2011 | Baker | | |

(Continued)

OTHER PUBLICATIONS

D. Badura and A. Hlawiczka, "Low cost BIST for EDAC circuits," Test Symposium, 1997. (ATS '97) Proceedings., Sixth Asian, Akita, 1997, pp. 410-415.*

*Primary Examiner* — Cynthia Britt
(74) *Attorney, Agent, or Firm* — Patent Capital Group

(57) ABSTRACT

A system implementing an MBIST device is disclosed. The system includes an ECC-protected memory and the MBIST device for self-test of the memory. The MBIST device includes a first access port communicatively connected to the memory via a first path, the first path excluding the ECC logic associated with the embedded memory, and a second access port communicatively connected to the memory via a second path, the second path including the ECC logic associated with the memory. The device is configured to test the memory, in a first mode of operation, via the first path and, in a second mode of operation, via the second path. One advantage of such system includes re-using, with little additional die area, of MBIST logic already required for manufacturing test of the product (first mode of operation) for system or application level tests that may be carried out by customers (second mode of operation).

20 Claims, 8 Drawing Sheets

(56) References Cited

U.S. PATENT DOCUMENTS

2011/0225475 A1* 9/2011 Kumar ................ G06F 11/1052
714/763
2014/0317460 A1 10/2014 Kleveland et al.

* cited by examiner

MBIST DEVICE FOR USE WITH ECC-PROTECTED MEMORIES

TECHNICAL FIELD OF THE DISCLOSURE

The present disclosure relates to the field of memories, in particular to systems and methods for performing memory built-in self-test on error correction code protected memories.

BACKGROUND

Recent advances in semiconductor design and fabrication methods enable ever increasing miniaturization of electronic circuits. Complete systems comprising microprocessors, communication logic and, in particular, memories can now be found on a single semiconductor chip. Such systems-on-a-chip (SOC) have a multiplicity of technologies that previously had a high space requirement as separate components on a circuit board.

While, in the past, semiconductor chips were dominated by logic functions and separate memories were provided externally, modern integrated circuits increasingly require embedded memories on a semiconductor chip itself. Embedded memories may be present in semiconductor chips as different memory blocks in different sizes and forms. As a result of the integration of memories on a semiconductor chip, it is possible to save space. In addition, as a result of eliminating or reducing interfaces and speed-impeding factors such as circuit boards, the speed of memory accesses can be increased.

Embedded memories in a system-on-a-chip have to be very reliable and tested accordingly. Therefore, a memory self-test device, sometimes referred to as a "memory built-in self-test" (MBIST) device, is usually provided in a system-on-a-chip having embedded memories, said device being tailored to the embedded memories provided in the system. Such a device then carries out a memory self-test, for example during or after the fabrication of the corresponding semiconductor chip.

OVERVIEW

One aspect of the present disclosure provides a device (MBIST device) for memory self-test of a memory, e.g. memory embedded in a semiconductor chip. The MBIST device includes a first access port and a second access port. The first access port is configured to test, in a first mode of operation of the device, the memory via a first path between the first access port and the memory. The second access port is configured to test, in a second mode of operation of the device, the memory via a second path between the second access port and the memory. The first path excludes error-correction code (ECC) logic associated with the memory, while the second path includes the ECC logic associated with the memory. In various embodiments, MBIST devices described herein may be provided as integrated solutions, e.g. by being included, either in part, or in whole, in SOC or IC packages, or provided as discrete solutions by being implemented as separate devices.

Another aspect of the present disclosure provides a system, e.g. a SOC or an IC, implementing such an MBIST device. The system includes a memory, e.g. memory embedded in a semiconductor chip, and an ECC logic associated with the memory by being configured to correct or detect errors in reading and/or writing data to the memory by applying one or more ECC algorithm. The system further includes an MBIST device for self-test of the memory. The device includes a first access port communicatively connected to the memory via a first path, the first path excluding the ECC logic associated with the memory, and a second access port communicatively connected to the memory via a second path, the second path including the ECC logic associated with the memory. The device is configured to test, in a first mode of operation of the device, the memory via the first path. The device is further configured to test, in a second mode of operation of the device, the memory via the second path.

As used herein, the term "path" used in the present disclosure in context of describing a path between a particular access port of an MBIST device and a memory that the MBIST device is configured to test refers to a communication path for testing of the memory by e.g. communicating address, control, and/or data signals between the access port and the memory.

As used herein, describing that a path between a particular access port of an MBIST device and a memory includes an ECC logic refers to a path such that the address, control, and/or data signals that may be communicated between the access port and the memory traverse the ECC logic and the ECC logic may act on these signals (i.e., there is an ECC logic between the access port and the memory).

Similarly, as used herein, describing that a path between a particular access port of an MBIST device and a memory excludes an ECC logic refers to a path such that the address, control, and/or data signals that may be communicated between the access port and the memory do not traverse an ECC logic which may or may not be present on a chip. In such a case, even if the memory is provided with such an ECC logic, the ECC logic cannot act on the signals communicated between the access port and the memory (i.e., there is no ECC logic between the access port and the memory).

Yet another aspect of the present disclosure relates to a method for memory self-test of a memory using an MBIST device described herein.

Still other aspects of the present disclosure relate to computer programs and computer-readable storage media, preferably non-transitory, comprising software code portions (i.e. computer-readable instructions) configured for, when executed on/by a processor or any kind of controller, carrying out methods for memory self-test described herein.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Basics of IC Test Flow

Figure 1:
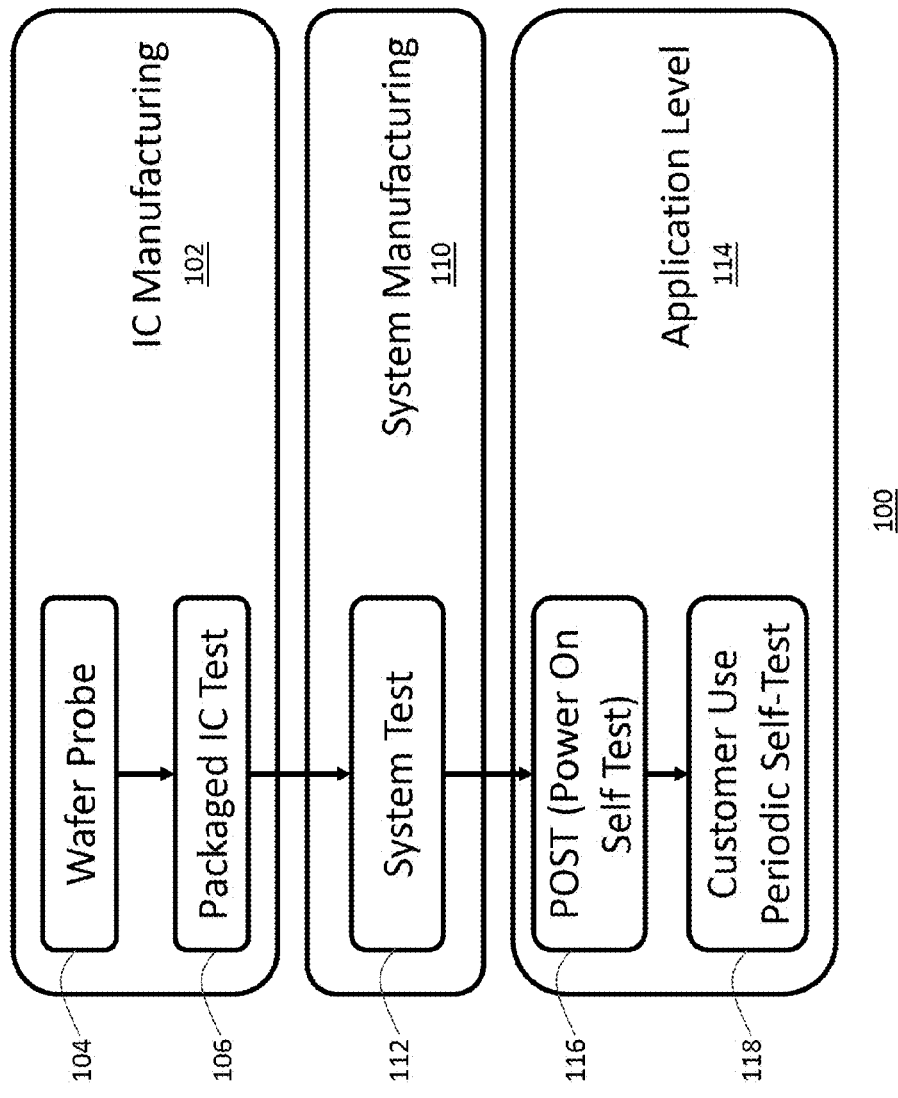
FIG. 1 is a diagram illustrating a typical IC test flow.

FIG. 1 is a diagram illustrating a typical IC test flow 100. As shown in FIG. 1, an IC may be tested at multiple stages. During an IC manufacturing stage 102, which is typically the first stage, an IC manufacturer may perform a wafer probe test 104 by testing of component(s) in a wafer form and/or perform a packaged IC test 106 by testing the final packaged IC form.

Once a packaged IC component is assembled into a system, it may be tested in a system manufacturing stage 110 by undergoing a system test 112. In stage 110, multiple system tests 112 may be performed as sub-assemblies are integrated into higher level systems.

Once the system that includes the IC is deployed in a particular final application, the IC may be tested in an application level stage 114. At that test stage, an IC will often have the ability to perform self-tests to report the pass/fail status of an electronic system comprising the IC, e.g. at power-on of the system, shown in FIG. 1 as Power on Self-Test (POST) 116, and/or periodically during normal operation, shown in FIG. 1 as periodic self-test 118, to ensure continuous correct operation of the electronic system.

The demand for application level self-test capability is increasing, motivated by the need for electronic systems to meet functional safety requirements of standards such as e.g. ISO 26262 "Road vehicles—Functional safety" standard or IEC 61508 "Functional Safety of Electrical/Electronic/Programmable Electronic Safety-related Systems" standard.

Existing Use of MBIST

Figure 2:
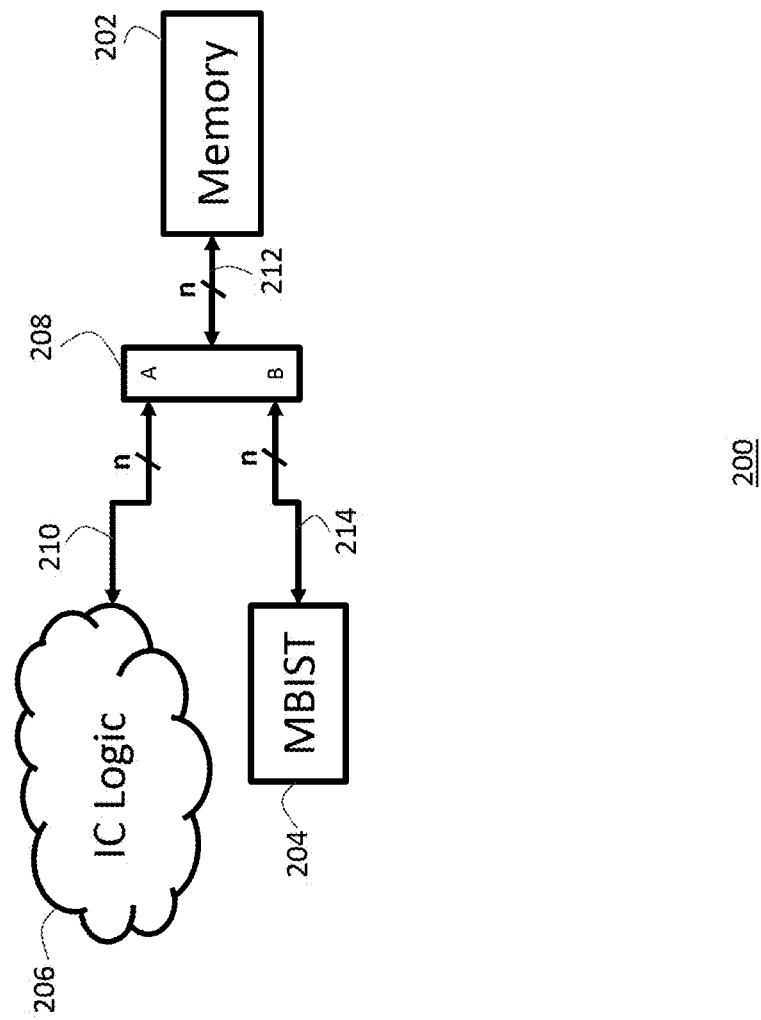
FIG. 2 is a diagram illustrating a system implementing an MBIST device for testing of a memory.

FIG. 2 is a diagram illustrating a system 200, e.g. implemented as an IC, comprising a memory 202, e.g. embedded memory 202, for storing data and an MBIST device 204. FIG. 2 further illustrates digital IC logic 206 which is typically also included within the system 200, e.g. by being a part of a SOC comprising the memory 202, the MBIST 204, and the IC logic 206, but could, alternatively, also be external to the system 200.

The MBIST device 204 is configured to test the memory 202 as described below. However, besides testing the memory 202 illustrated in FIG. 2, in a similar manner the MBIST 204 may be configured to test other memories that may be present within the system 200, such other memories not being shown in FIG. 2.

Both the MBIST device 204 and the IC logic 206 are communicatively connected to the memory 202 so that they can access (e.g. read or write) data in the memory 202. However, while the MBIST device 204 accesses data in the memory 202 when the memory 202 of the system 200 is being tested, typically as a part of the IC manufacturing test stage 102 described above, the IC logic 206 accesses data in the memory 202 during normal (i.e., non-testing) operation when the system 200 is operating in a so-called "mission mode." To that end, the IC logic 206 comprises systems and devices that may access (read, write, etc.) data stored in the memory 202 during the mission mode.

In an embodiment, a switch matrix 208 may be used to connect the MBIST device 204 and the IC logic 206 to the memory 202. Such a switch matrix could involve any method and comprise any device capable of connecting each of the MBIST 204 and the IC logic 206 to the memory 202 so that the connected devices could communicate data, including, but not limited to, e.g. one or more wrappers, collars, or multiplexers. In various embodiments, the switch matrix may be included in the MBIST itself or be implemented as an element apart and distinct from the MBIST.

During mission mode operation of the system 200, the IC logic 206 may access the memory 202 by communicating address, control, and data signals via a communication path 210 (indicated as path "A" in FIG. 2) between the IC logic 206 and the switch matrix 208 and a communication path 212 between the switch matrix 208 and the memory 202. During the memory test mode operation of the system 200, the MBIST device 204 may access the memory 202 by communicating address, control, and data signals via a communication path 214 (indicated as path "B" in FIG. 2) between the MBIST device 204 and the switch matrix 208 and then, again, the communication path 212 between the switch matrix 208 and the memory 202 is used.

When the memory 204 is not an ECC-protected memory, the communications paths 210, 212, and 214 may be configured to carry the data words (i.e. any data structures) that are n bits wide. This is illustrated in FIG. 2 with the letter "n" being present over the communication paths 210, 212, and 214. In other words, when the memory 204 is not an ECC-protected memory, the communications paths 210, 212, and 214 are typically configured to be of the same width (n bits).

IC manufacturers typically include an MBIST device such as the device 204 on the same semiconductor chip as the one embedding the memories that the MBIST device is designed to test, however it is not required that the MBIST be included on the same IC as the memory being tested. Such an approach allows IC manufacturers to carry out accurate, efficient and economic testing of the manufactured memory chips before they are shipped out to customers (i.e. during an IC manufacturing test stage described above). Once such a memory chip is shipped from a IC manufacturer to a customer, the customer may use the MBIST device included therein to carry out further testing of the embedded memories, e.g. as a part of system manufacturing and/or application level test stages described above.

Continuing the Existing Use of MBIST with ECC-Protected Memories

Memory systems that require increased reliability often employ ECC logic that can apply various ECC algorithms to detect and, possibly, correct errors in reading and/or writing data to the memory, thereby advantageously adding error tolerance to the system. While such ECC-protected memories may be very advantageous in numerous settings, presence of the ECC logic limits the usability of the MBIST devices in the form as they are currently included in on memory chips, in particular in system and application level test stages. The differences associated with use of an MBIST device to test a memory without an ECC protection and an ECC-protected memory may be explained by comparing FIGS. 2 and 3.

Figure 3:
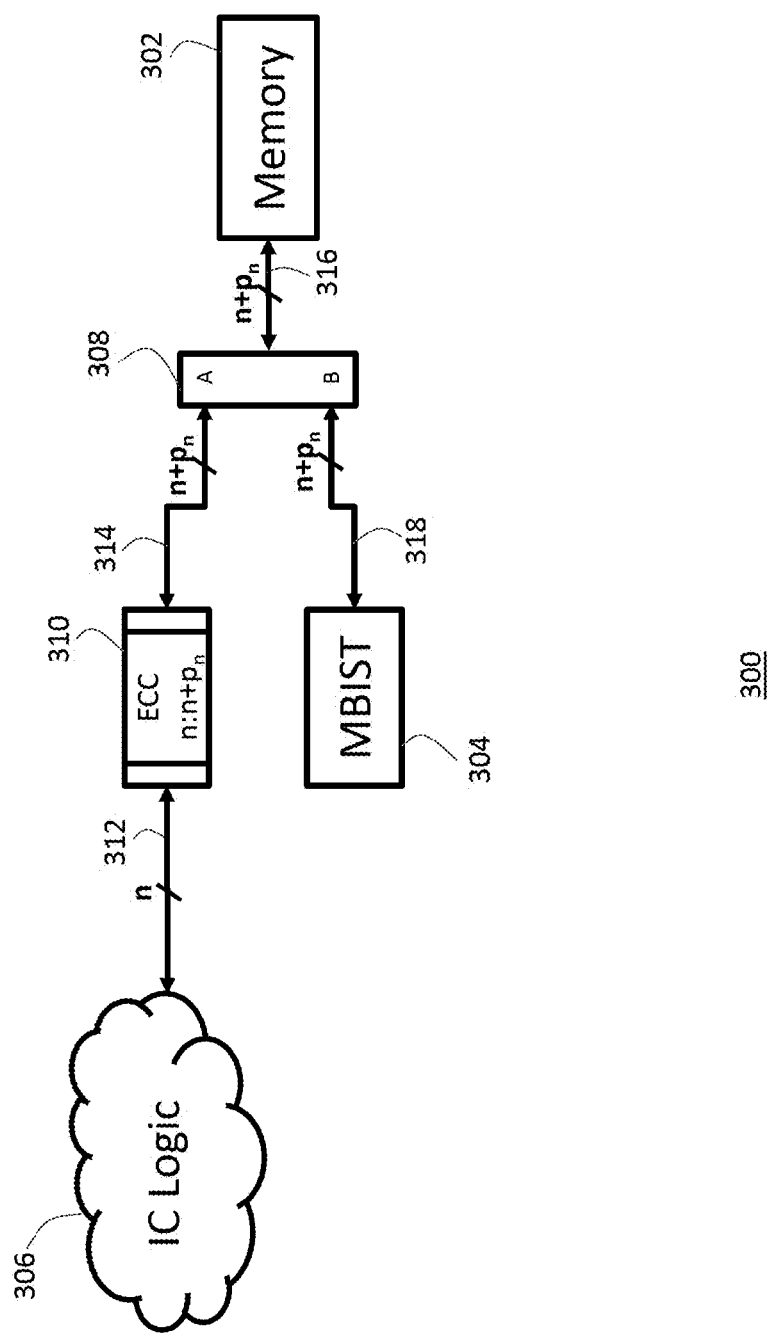
FIG. 3 is a diagram illustrating a system implementing an MBIST device for testing of an ECC-protected memory.

FIG. 3 is a diagram illustrating a system 300 implementing an MBIST for testing of an ECC-protected memory. As shown in FIG. 3, the system 300 may include a memory 302, an MBIST device 304, a digital IC logic 306, and a switch matrix 308, which are analogous to, respectively, the memory 202, the MBIST device 204, the IC logic 206, and the switch matrix 208 illustrated in FIG. 2. Therefore, descriptions provided for the elements 202, 204, 206, and 208 with reference to FIG. 2 are applicable to the elements 302, 304, 306, and 308 shown in FIG. 3 and, therefore, in the interests of brevity are not repeated.

Unlike the memory 202 shown in FIG. 2, the memory 302 is an ECC-protected memory because the system 300 includes an ECC logic 310 configured to apply ECC algorithm(s) to detect and/or correct errors in the IC logic 306 reading and/or writing data to the memory 302. Functionality of the ECC logic 310 is now described.

In mission mode, the IC logic 306 issues commands to write and read n-bit data words to the memory 302. When the IC logic 306 writes an n-bit data word to the memory 302, the ECC logic 310 receives the n-bit data word from the IC logic 306, over a communication path 312 between the IC logic 306 and the ECC logic 310, and encodes "$p_n$" parity bits that are concatenated onto the n-bit data word, resulting in a data value of width "$n+p_n$" (where the subscript "n" in "$p_n$" represents that the parity bit width "p" is a function of the data word width "n"). The "$p_n$" bits described can also apply to non-parity based error correction methods such as voting logic, redundancy logic etc. where additional memory bits are used for error correction. The data value of width "$n+p_n$" is then what is physically written in the memory 302 through path "A" of the switch matrix 308 (i.e. the data value of width "$n+p_n$" is first communicated from the ECC logic 310 to the switch matrix 308 via a communication path 314 and then from the switch matrix 308 to the memory 302 via a communication path 316). When the IC logic 306 executes a read transaction, ($n+p_n$) bits are read from the memory 302 (via the paths 316 and 314) to the ECC logic 310 and then the ECC logic 310 translates the read ($n+p_n$) bits into the logical data of width n which is then provided to the IC logic 306 over the path 312. Depending on the specific ECC algorithm used by the ECC logic 310 and as it well-known in the art, the parity bits "$p_n$" may enable the ECC logic 310 to correct one or more bit errors in the data word that was read from the memory 302, as well as detect two or more bit errors.

IC manufacturers require the ability to control and observe every bit cell of the memory 302 during the IC manufacturing test stage. Because of the error correction properties of ECC, the ECC logic 310 would interfere with the ability to control and observer every physical bit in the memory if the ECC logic was in the MBIST test path. As a result, in the existing systems that employ ECC-protected memories, the MBIST device 304 is connected to the memory 302 by the switch matrix 308 so that the ECC logic 310 is not in the MBIST test path. Such a configuration is shown in FIG. 3 with the MBIST device 304 being connected to the switch matrix 308 via a communication path 318, and then being further connected to the memory 302 via the path 316 between the switch matrix 308 and the memory 302 and the ECC logic 310 being excluded from the path between the MBIST device 304 and the memory 302. In such a configuration, the MBIST device is able to carry out tests on every bit cell of the physical memory 302 by operating on the physical data width "$n+p_n$" with no ECC encoding or decoding.

While the MBIST 304 in the system 300 would operate as desired and as expected during the IC manufacturing test stage 102 by testing every bit cell of the memory 302, the errors that could be discovered during this early test stage of IC manufacturing do not adversely impact the system manufacturing test stage 110 and the application level test stage 114 because at the system and application levels such errors could have been corrected by the ECC logic 310. In other words, if used in system and application level tests of the system 300, the MBIST device 304 would generate fault messages for errors which are potentially corrected by the ECC logic 310 and, therefore, are not considered "errors" for the purpose of system and application level test and normal operation.

To overcome this issue, one approach to carrying out system and application level tests of ECC-corrected memories involves implementing a fully independent additional MBIST device on the ECC-protected port of the embedded memory. Such an approach has, however, drawbacks of requiring additional die area on the chip, thereby increasing the cost of the product. Another approach requires customers to implement software to execute memory self-test routines during their system and application level test stages. Such an approach has drawbacks of requiring development time as well as longer execution times, as compared to hardware driven memory built-in self-testing using an MBIST device. In addition, software driven self-test may not even be possible for deeply embedded memories that cannot be directly controlled and observed by software.

Therefore, what is needed in the art are the improved methods and systems for testing of ECC-protected memories in various stages of an IC test flow.

Proposed Use of MBIST with ECC-Protected Memories

Embodiments of the present disclosure allow reducing or eliminating at least some of the problems described above. In particular, embodiments of the present disclosure are based on an insight that an MBIST device used for direct testing of memories during an IC manufacturing test stage and, therefore, already present on a semiconductor chip that contains the memories to be tested, may be re-configured to also be able to test the same memories used in combination with their ECC protection logic. Such re-configured MBIST device could then be also used in system manufacturing and application level stages of an IC test flow, eliminating the need to implement an additional independent MBIST device for testing in system manufacturing and application level stages and reducing or eliminating the need for customers to use software-based testing routines to test memories at these stages. To that end, an MBIST device comprising at least a first and a second access ports is proposed that, in operation, can test an embedded memory in at least two modes. In a first mode, the device is configured to use the first access port connected to the embedded memory to be tested via a first communication path, the first path excluding the ECC logic associated with (i.e. configured to provide ECC protection for) the memory. In a second mode, the device is configured to use the second access port connected to the embedded memory via a second communication path, the second path including the ECC logic associated with the memory. In this manner, the same MBIST device may be shared between IC manufacturing stage testing and system or application stage testing, where the manufacturing test may access all bits directly (in the first mode of operation), but the system/application level test takes into consideration the ECC logic so that single-bit errors do not trigger fault messages in the application (in the second mode of operation). An exemplary illustration of such a device is provided in FIG. 4.

Figure 4:
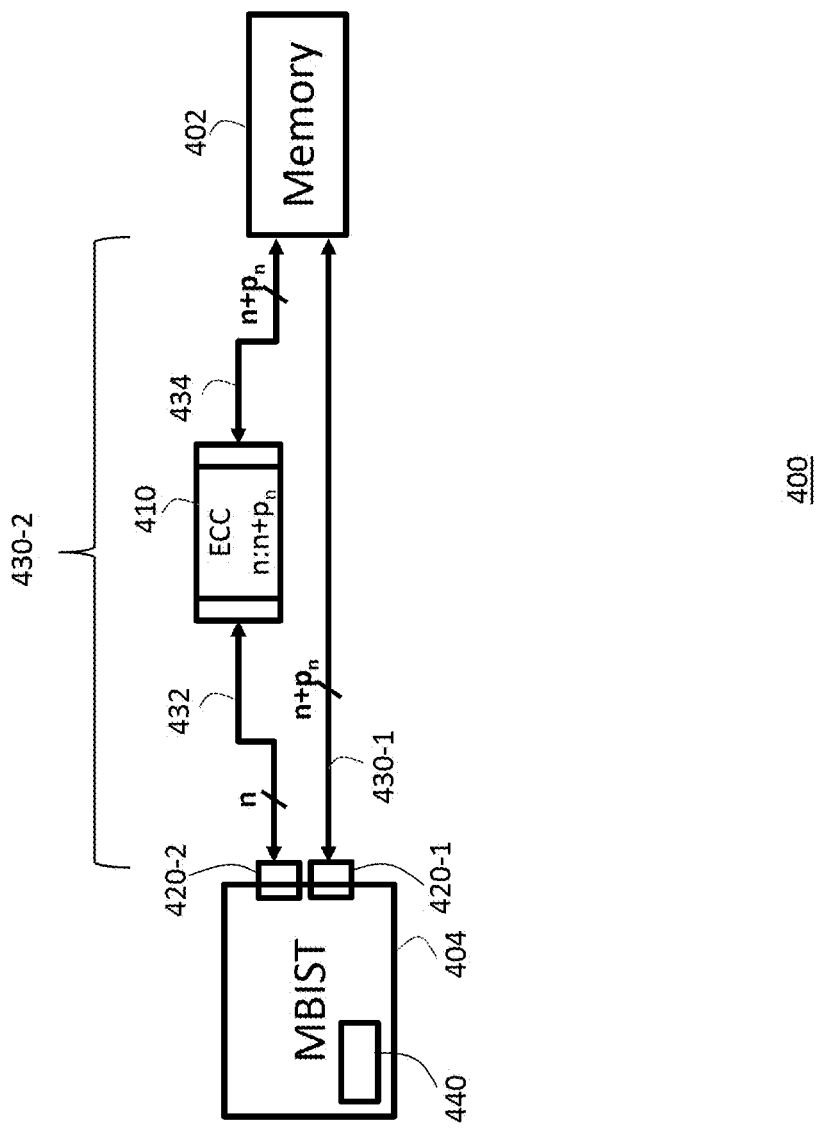
FIG. 4 is a diagram illustrating a system implementing an MBIST device for an ECC-protected memory, according to one embodiment of the present disclosure.

FIG. 4 is a diagram illustrating a system 400 implementing an MBIST device 404 for an ECC-protected memory 402, according to one embodiment of the present disclosure.

The ECC protection to the memory 402 is provided by an ECC logic 410. To that end, when the system 400 operates in mission mode, an IC logic (not shown in FIG. 4, but shown in the example of FIG. 6) may issue commands to write and read n-bit data words to the memory 402. When the IC logic writes an n-bit data word to the memory 402, the ECC logic 410 receives the n-bit data word from the IC logic and encodes "$p_n$" parity bits that are concatenated onto the n-bit data word, resulting in a data value of width "$n+p_n$", which data value of width "$n+p_n$" is then what is physically written in the memory 402. When the IC logic executes a read transaction, $(n+p_n)$ bits are read from the memory 402 to the ECC logic 410 and then the ECC logic 410 translates the read $(n+p_n)$ bits into the logical data of width n which is then provided to the IC logic. Depending on the specific ECC algorithm used by the ECC logic 410 such parity bits "$p_n$" may enable the ECC logic 410 to correct one or more bit errors in the data word that was read by the IC logic from the memory 402, as well as detect two or more bit errors.

As shown in FIG. 4, the MBIST device 404 includes at least a first access port 420-1 and a second access port 420-2. The first and second access ports may comprise any kind of port for receiving and transmitting data, in particularly data used in testing of the memory 402, and could e.g. include any type of wrapper, collar, etc. that attaches an MBIST to a memory.

The first access port 420-1 is communicatively connected to the memory 402 via a first communication path 430-1 that does not traverse the ECC logic 410. The second access port 420-2, however, is communicatively connected to the memory 402 via a second communication path 430-2 that does traverse the ECC logic 410. As shown in FIG. 4, the second communication path comprises a communication path 432 for communicating data between the second access port 420-2 and the ECC logic 410 and a communication path 434 for communication data between the ECC logic 410 and the memory 402. During testing, in a first mode of operation of the device 404, the device 404 is configured to test the memory 402 by using the first access port 420-1 and communicating via the first path 430-1, while, in a second mode of operation, the device 404 is configured to test the memory 402 by using the second access port 420-2 and communicating via the second path 430-2.

The testing in any mode of operation of the device 404 may include the device 404 carrying out memory built-in self-tests, such as e.g. Checkerboard and March algorithms, Data Retention tests, Neighborhood Pattern Sensitive Fault tests, etc. A device such as the device 404 configured to carry out any type of self-test is within the scope of the present disclosure.

In an embodiment, during the testing of the embedded memory 402, the device 404 may be configured to communicate address, control, and/or data signals between the first access port 420-1 and the embedded memory 402 via the first path 430-1 and communicate address, control, and/or data signals between the second access port 420-2 and the embedded memory 402 via the second path 430-2.

When the system 400 operates in memory test mode and the MBIST device 404 operates in the second mode, the MBIST device 404 is configured to operate on data words to which the ECC logic 410 applies ECC correction algorithms similar as how it is done with the IC logic during the mission mode. Namely, when, as a part of the testing, the MBIST device 404 writes an n-bit data word from the second access port 420-2 to the memory 402, the ECC logic 410 receives the n-bit data word from the second access port 420-2 and encodes "$p_n$" parity bits that are concatenated onto the n-bit data word, resulting in a data value of width "$n+p_n$", which data value of width "$n+p_n$" is then what is physically written in the memory 402. When, as a part of the testing, the MBIST device 404 executes a read transaction, $(n+p_n)$ bits are read from the memory 402 to the ECC logic 410 and then the ECC logic 410 translates the read $(n+p_n)$ bits into the logical data of width n which is then provided to the second access port 420-2. Thus, when the MBIST device 404 operates in the second mode, the second access port 420-2 is configured to communicate data structures (e.g. words) of n bits.

In contrast, when the system 400 operates in memory test mode and the MBIST device 404 operates in the first mode, the MBIST device 404, in particular the first access port 420-1 is configured to communicate data structures of $n+p_n$ bits (i.e. data that is written into the physical memory, without the ECC algorithms applied thereto).

In an embodiment, the MBIST device 404 may further include a controller 440 for controlling the mode of operation of the device 404 (i.e. configured to switch the mode of operation between at least a first and a second mode). The controller 440 may be configured to switch mode of operation of the device 404 based on various factors. For example, in an embodiment, the controller 440 may be configured to ensure that the device 404 enters the second mode of operation to test the memory 402 periodically or at predetermined times, or in some other predefined manner, in order to automatically test the memory 402 at the system or application levels. In an embodiment, the controller 440 may be configured to ensure that the device 404 enters the second mode of operation to test the memory 402 in response to receiving an instruction to do so. Such an instruction may be provided to the controller 440 in a form of e.g. user input, e.g. provided via a user interface that may be included with the controller 440, or be provided from some further system or a device, e.g. from a sensor device, thus triggering system/application level testing of the ECC-protected memory 402.

Figure 8:
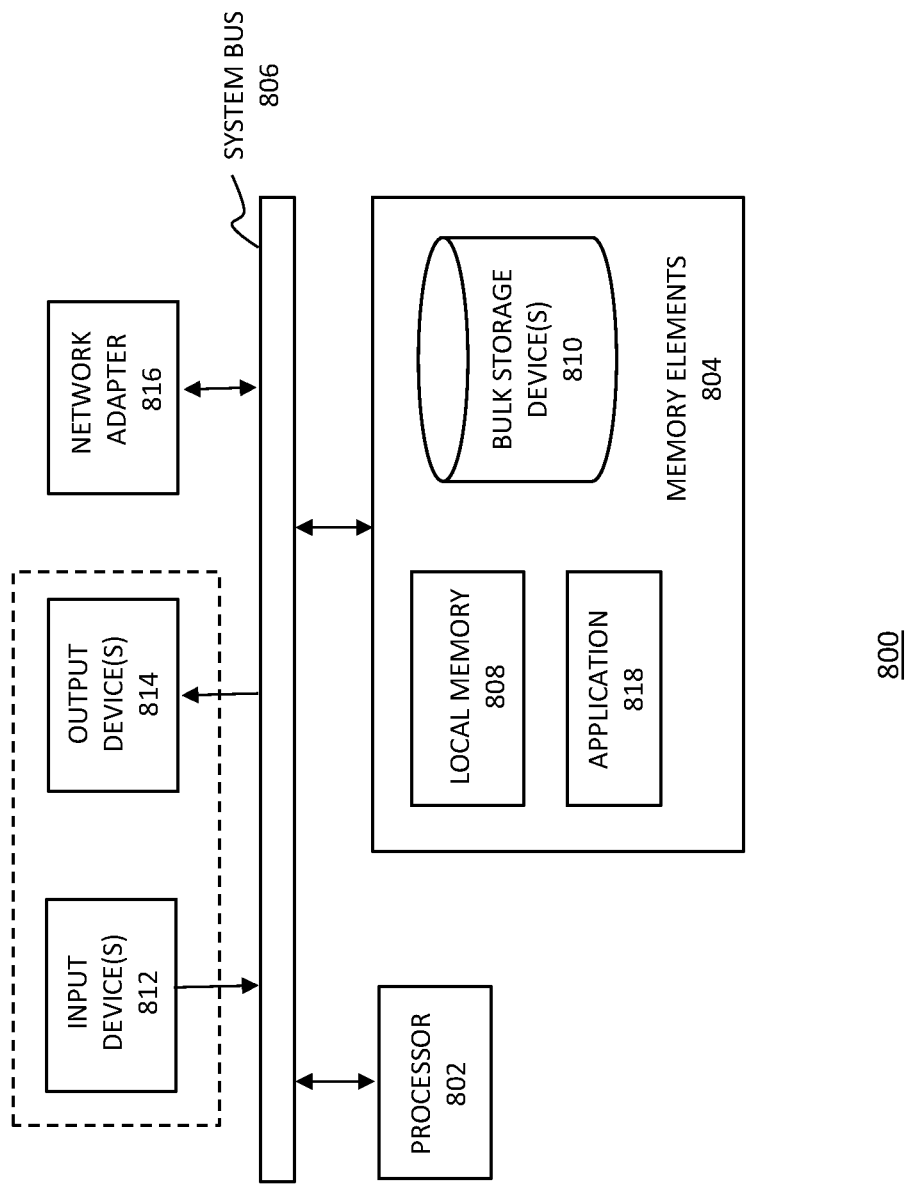
FIG. 8 depicts a block diagram illustrating an exemplary data processing system, according to one embodiment of the present disclosure.

An example of a data processing system that could be configured to implement the functionality of an MBIST controller (i.e., a controller of any of the MBIST devices described herein), such as e.g. the controller 440 described herein is illustrated in FIG. 8. However, a person skilled in the art will recognize that any system, configured to carry out or comprising any of the features of the MBIST controller as described herein, is within the scope of the present disclosure. Furthermore, while FIG. 4 illustrates that the controller 440 is included within the MBIST device 404, in other embodiments, such an MBIST controller may be implemented externally to the MBIST device by e.g. being in a wireless communication with the MBIST device, as long as the MBIST controller may control the testing process as described herein.

Figure 5:
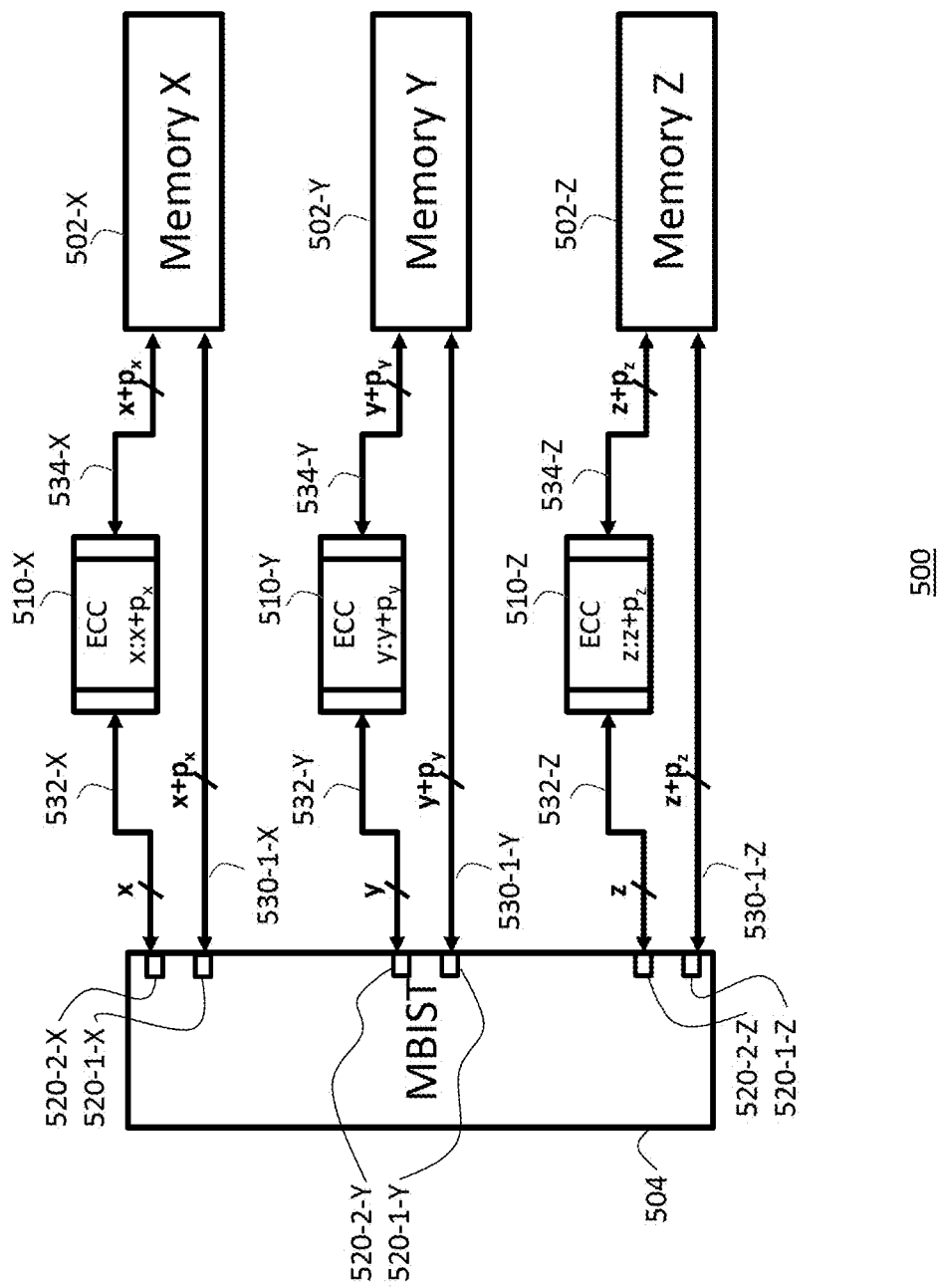
FIG. 5 is a diagram illustrating a system implementing an MBIST device for multiple ECC-protected memories, according to an embodiment of the present disclosure.

In an embodiment, the MBIST device 404 may be configured to test multiple ECC-protected memories, where each memory is tested as described for a single memory example of FIG. 4. This situation is shown in FIG. 5 providing a diagram illustrating a system 500 implementing an MBIST device 504 for multiple ECC-protected memories, according to an embodiment of the present disclosure. FIG. 5 illustrates an example comprising three ECC-protected memories 502-X, 502-Y, and 502-Z, however a system comprising any number of such memories is within the scope of the present disclosure. Each of the memories 502 is associated with a respective ECC logic 510 having the same index (X, Y, or Z) as the memory. The communication paths are shown as paths 530-1, 532, and 534 having respective index (X, Y, or Z) for each of the respective memories 502-X, 502-Y, and 502-Z. Elements shown in FIG. 5 as 5xx elements, possibly with an index to differentiate between the different memories of FIG. 5, are analogous to elements shown in FIG. 4 as corresponding 4xx elements and, in the interests of brevity, their discussion is not repeated here. In order to not clutter the drawing of FIG. 5, the second communication path for each of the memories is not expressly indicated in FIG. 5, however, analogous to the second communication path described in FIG. 4, such a path would communicatively connect the second access port 520-2 of each of the memories to the respective memory and include the corresponding ECC logic 510.

As indicated in FIG. 5 with different indices x, y, and z within the device 504, the second access ports 520-2 corresponding to different memories 502-X, 502-Y, and 502-Z may be configured to communicate data structures of different number of bits (i.e., x, y, and z bits, for communicating with each of the memories 502-X, 502-Y, and 502-Z, respectively). Further, as indicated in FIG. 5 with different indices $p_x$, $p_y$, and $p_z$, the ECC logic 510 corresponding to different memories 502-X, 502-Y, and 502-Z may be configured to implement different number of parity bits (i.e., $p_x$, $p_y$, and $p_z$ bits, with respect to the memories 502-X, 502-Y, and 502-Z, respectively). Therefore, the first access ports 520-1 corresponding to different memories 502-X, 502-Y, and 502-Z may be configured to communicate data structures of different number of bits (i.e., $x+p_x$, $y+p_y$, and $z+p_z$ bits, for communicating with each of the memories 502-X, 502-Y, and 502-Z, respectively).

Figure 6:
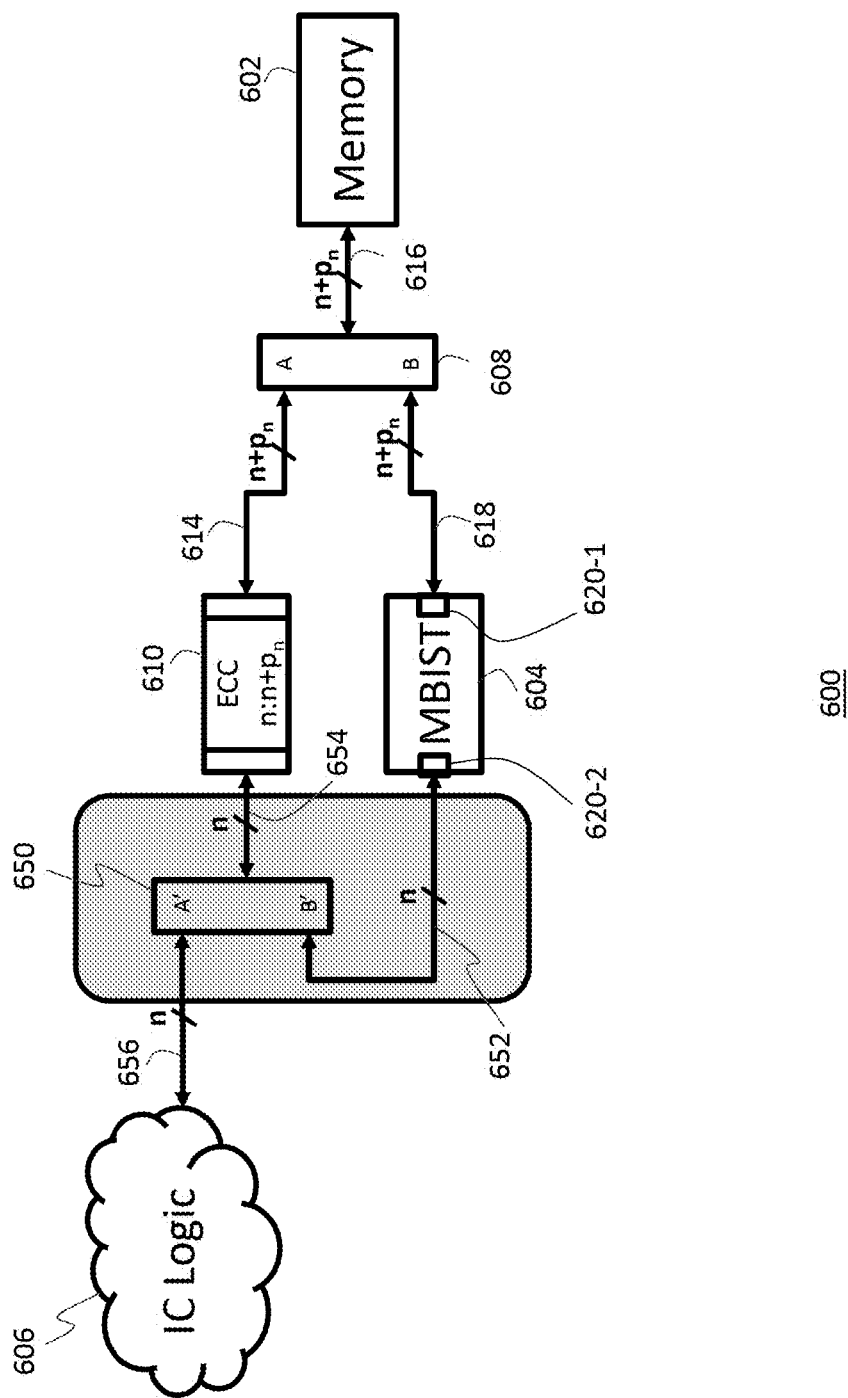
FIG. 6 is a diagram illustrating a system implementing an MBIST device for an ECC-protected memory, according to another embodiment of the present disclosure.

FIG. 6 is a diagram illustrating a system 600 implementing an MBIST device 604 for an ECC-protected memory 602, according to another embodiment of the present disclosure. As shown in FIG. 6, the system 600 may include a memory 602, an ECC logic 610, and an MBIST device 604 comprising a first access port 620-1 and a second access port 620-2, which are analogous to, respectively, the memory 402, the ECC logic 410, and the MBIST device 404 comprising the first access port 420-1 and the second access port 420-2 illustrated in FIG. 4. In fact, in comparison with FIG. 4, FIG. 6 merely provides further details of one exemplary implementation of the MBIST device 404 with the ECC-protected memory 402. Therefore, descriptions provided for the elements 402, 410, 404, 420-1, and 420-1 with reference to FIG. 4 are applicable to the elements 602, 610, 604, 620-1, and 620-2 shown in FIG. 4 and, therefore, in the interests of brevity are not repeated here.

In particular, FIG. 6 illustrates how a digital IC logic 606 could be connected to the memory 602. Functionality of the digital IC logic 606 is analogous to that described for the IC logic 306 shown in FIG. 3, which description, therefore, is not repeated here.

In order to enable communications according to embodiments described herein, two switch matrices may be implemented—a switch matrix 608 and a switch matrix 650. Functionality of the switch matrix 608 as well as communication paths 614, 616, and 618 is analogous to the described for the switch matrix 308 and the communication paths 314, 316, and 318 shown in FIG. 3, which description, therefore, is also not repeated here.

Unlike the illustration of FIG. 3, FIG. 6 includes the switch matrix 650 configured to connect the MBIST device 604 to the memory 602 via communication paths 652, 654, 614, and 616, and to connect the IC logic 606 to the memory 202 via communication paths 656, 654, 614, and 616. Such a switch matrix could involve any method and comprise any device capable of connecting each of the MBIST device 604 and the IC logic 606 to the memory 602 so that the connected devices could communicate data, including, but not limited to, e.g. one or more wrappers, collars, or multiplexers. In various embodiments, the switch matrix may be included in the MBIST itself or be implemented as an element apart and distinct from the MBIST.

During mission mode operation of the system 600, the IC logic 606 may access the memory 602 by communicating address, control, and data signals via the communication path 656 (indicated as path "A'" in FIG. 6) between the IC logic 606 and the switch matrix 650, the communication path 654 between the switch matrix 650 and the ECC logic 610, the communication path 614 (indicated as path "A" in FIG. 6, similar to the path A of FIG. 3) between the ECC logic 610 and the switch matrix 608, and the communication path 616 between the switch matrix 608 and the memory 602.

During memory test mode operation of the system 600, the MBIST device 604 may access the memory 602 in one of two ways, depending on the mode of operation of the MBIST device 602. When operating in the first mode, the MBIST device 604 uses the first access port 620-1 to access the memory 602, while, when operating in the second mode, the MBIST device 604 uses the second access port 620-2 to access the memory 602.

The first access port 620-1 is communicatively connected to the memory 602 via a first communication path that does not traverse the ECC logic 610. The first communication path comprises the communication path 618 (indicated in FIG. 6 as path "B") for communicating data between the first access port 620-1 and the switch matrix 608, and the communication path 616 for communication data between the switch matrix 608 (path B) and the memory 602.

The second access port 620-2 is communicatively connected to the memory 602 via a second communication path that does traverse the ECC logic 610. As shown in FIG. 6, the second communication path comprises the communication path 652 for communicating data between the second access port 620-2 and the switch matrix 650 (path B'), the communication path 654 for communicating data between the switch matrix 650 (path B') and the ECC logic 610, the communication path 614 for communication data between the ECC logic 610 and the switch matrix 608 (path A), and the communication path 616 for communication data between the switch matrix 608 (path A) and the memory 602.

When the system 600 operates in memory test mode and the MBIST device 604 operates in the second mode, the MBIST device 604 is configured to operate on data words to which the ECC logic 610 applies ECC correction algorithms similar as how it is done with the IC logic during the mission mode. Namely, when, as a part of the testing, the MBIST device 604 writes an n-bit data word from the second access port 620-2 to the memory 602 (via the path B'), the ECC logic 610 receives the n-bit data word from the second access port 620-2, via the switch matrix 650, and encodes "$p_n$" parity bits that are concatenated onto the n-bit data word, resulting in a data value of width "$n+p_n$", which data value of width "$n+p_n$" is then what is physically written in the memory 602, via path A of the switch matrix 608. When, as a part of the testing, the MBIST device 604 executes a read transaction, ($n+p_n$) bits are read from the memory 602 to the ECC logic 610, via the switch matrix 608, and then the ECC logic 610 translates the read ($n+p_n$) bits into the logical data of width n which is then provided to the second access port 620-2 (via path B' of the switch matrix 650). Thus, when the MBIST device 604 operates in the second mode, the second access port 620-2 is configured to communicate data structures (e.g. words) of n bits.

In contrast, when the system 600 operates in memory test mode and the MBIST device 604 operates in the first mode, the MBIST device 604, in particular the first access port 620-1 is configured to communicate data structures of $n+p_n$ bits (i.e. data that is written into the physical memory, without the ECC algorithms applied thereto) to the memory 602, via path B of the switch matrix 608.

Figure 7:
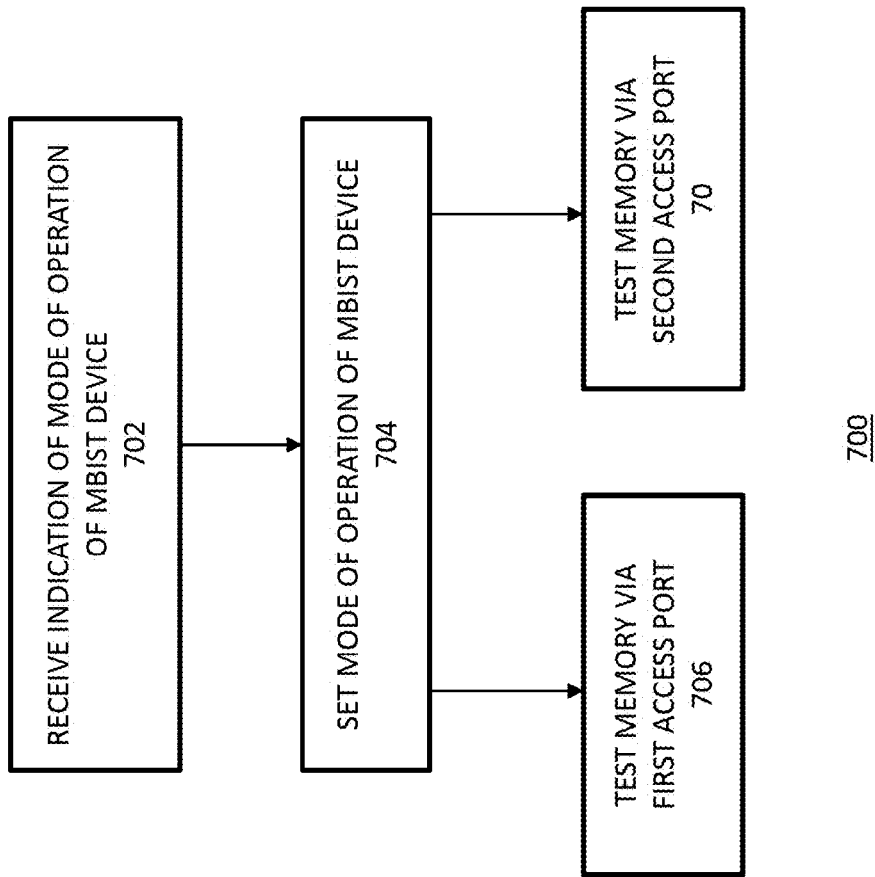
FIG. 7 is a flow diagram of method steps for controlling an MBIST device, according to one embodiment of the present disclosure.

FIG. 7 is a flow diagram 700 of method steps for controlling an MBIST device, according to one embodiment of the present disclosure. The method steps of FIG. 7 may be used by an MBIST controller (i.e. a controller of an MBIST device) such as e.g. the controller 440 of the MBIST device 604 or an analogous controller of the MBIST devices 504 or 604 (those controllers not shown in FIGS. 5 and 6). The method may begin with an optional step 702 where the MBIST controller may receive an indication of mode of operation for the MBIST device. Such indication could e.g. comprise user input indicating desired mode of operation. In step 704, the MBIST controller may set the MBIST device to the desired mode of operation, e.g. by activating the access port of the MBIST device to be used in that mode of operation (and, possibly, deactivating the access port(s) not used in that mode of operation). The method may then proceed either to step 706 or step 708, where step 706 illustrates the MBIST controller ensuring that the MBIST device tests one or more embedded memories via a first access port as described herein and, therefore, a first path, and step 708 illustrates the MBIST controller ensuring that the MBIST device tests one or more embedded memories via a second access port as described herein and, therefore, a second path.

Embodiments of the present disclosure enable the MBIST device used in IC manufacturing test stage to also be made accessible to system and application level self-test by providing the MBIST device with a special ECC access port, thus allowing self-test to utilize the error tolerance features of ECC logic as described herein. One advantage of systems comprising MBIST devices according to embodiments of the present disclosure include re-using, with little additional die area, of MBIST logic already required for manufacturing test of the product (first mode of operation described herein) for system or application level tests that may be carried out by customers (second mode of operation described herein). Other advantages include enabling customers to meet industry requirements for Functional Safety (such as the IEC 61508 standard) or other self-test requirements with a proven hardware-driven self-test, thereby eliminating or shortening their software development cycle, and preventing false returns by ensuring that the ECC logic is included during memory self-test by customers.

FIG. 8 depicts a block diagram illustrating an exemplary data processing system 800, according to one embodiment of the present disclosure. Such a data processing system could be configured to function as the MBIST controller described herein.

As shown in FIG. 8, the data processing system 800 may include at least one processor 802 coupled to memory elements 804 through a system bus 806. As such, the data processing system may store program code within memory elements 804. Further, the processor 802 may execute the program code accessed from the memory elements 804 via a system bus 806. In one aspect, the data processing system may be implemented as a computer that is suitable for storing and/or executing program code. It should be appreciated, however, that the data processing system 800 may be implemented in the form of any system including a processor and a memory that is capable of performing the functions described within this specification.

The memory elements 804 may include one or more physical memory devices such as, for example, local memory 808 and one or more bulk storage devices 810. The local memory may refer to random access memory or other non-persistent memory device(s) generally used during actual execution of the program code. A bulk storage device may be implemented as a hard drive or other persistent data storage device. The processing system 800 may also include one or more cache memories (not shown) that provide temporary storage of at least some program code in order to reduce the number of times program code must be retrieved from the bulk storage device 810 during execution.

Input/output (I/O) devices depicted as an input device 812 and an output device 814, optionally, can be coupled to the data processing system. Examples of input devices may include, but are not limited to, a keyboard, a pointing device such as a mouse, or the like. Examples of output devices may include, but are not limited to, a monitor or a display, speakers, or the like. Input and/or output devices may be coupled to the data processing system either directly or through intervening I/O controllers.

In an embodiment, the input and the output devices may be implemented as a combined input/output device (illustrated in FIG. 8 with a dashed line surrounding the input device 812 and the output device 814). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 816 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 800, and a data transmitter for transmitting data from the data processing system 800 to said systems, devices and/or networks. Modems, cable modems, and Ethernet cards are examples of different types of network adapter that may be used with the data processing system 800.

As pictured in FIG. 8, the memory elements 804 may store an application 818. In various embodiments, the application 818 may be stored in the local memory 808, the one or more bulk storage devices 810, or apart from the local memory and the bulk storage devices. It should be appreciated that the data processing system 800 may further execute an operating system (not shown in FIG. 8) that can facilitate execution of the application 818. The application 818, being implemented in the form of executable program code, can be executed by the data processing system 800, e.g., by the processor 802. Responsive to executing the application, the data processing system 800 may be configured to perform one or more operations or method steps described herein.

Variations and Implementations

While embodiments of the present disclosure were described above with references to exemplary implementations as shown in FIGS. 4-8, a person skilled in the art will realize that the various teachings described above are applicable to a large variety of other implementations. In particular, while some descriptions provided in the present disclosure refer to "embedded memories," these descriptions are equally applicable to memories that are not embedded.

In certain contexts, the features discussed herein can be applicable to automotive systems, safety-critical industrial applications, medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions.

In the discussions of the embodiments above, components of a system, such as e.g. clocks, multiplexers, buffers, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

Parts of various systems for testing of ECC-protected memories using MBIST devices as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer readable storage medium.

In one example embodiment, any number of electrical circuits of FIGS. 4-6 and 8 may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of FIGS. 4-6 and 8 may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of testing of ECC-protected memories using MBIST devices as proposed herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of FIGS. 4-8 may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of FIGS. 4-6 and 8 and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the testing of ECC-protected memories using MBIST devices as proposed herein illustrate only some of the possible functions that may be executed by, or within, system illustrated in FIGS. 4-6 and 8. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Note that all optional features of the apparatus described above may also be implemented with respect to the method or process described herein and specifics in the examples may be used anywhere in one or more embodiments.

What is claimed is:

1. A system comprising:
a memory;
an error correction code (ECC) logic associated with the memory by being configured to correct or detect errors in reading and writing data to the memory by applying one or more ECC algorithms; and
a device for memory self-test (MBIST) of the memory, the device comprising:
a first access port communicatively connected to the memory via a first path, the first path excluding the ECC logic associated with the memory, and
a second access port communicatively connected to the memory via a second path, the second path including the ECC logic associated with the memory,
wherein the device is configured to:
test, in a first mode of operation of the device, the memory via the first path, and
test, in a second mode of operation of the device, the memory via the second path.

2. The system according to claim 1, wherein:
the first access port of the device is configured to communicate data structures of $n+p_n$ bits, and
the second access port of the device is configured to communicate data structures of n bits,
where n bits are configured to encode data to be stored in the memory, and $p_n$ bits are configured to encode one or more bits added to the data to be stored in the memory by the ECC logic associated with the memory.

3. The system according to claim 1, further comprising:
a controller configured to switch a mode of operation of the device between at least the first mode and the second mode.

4. The system according to claim 3, wherein the controller is configured to switch the mode of operation of the device in accordance with user input indicative of a desired mode of operation of the device.

5. The system according to claim 1, wherein the device is configured to:
communicate first address, control, and/or data signals between the first access port and the memory via the first path, and
communicate second address, control, and/or data signals between the second access port and the memory via the second path.

6. The system according to claim 1, wherein:
the system further comprises an additional memory and an ECC logic associated with the additional memory by being configured to correct or detect errors in reading and/or writing data to the additional memory by applying one or more ECC algorithms,
the device further comprises:
a third access port communicatively connected to the additional memory via a third path, the third path excluding the ECC logic associated with the additional memory, and
a fourth access port communicatively connected to the additional memory via a fourth path, the fourth path including the ECC logic associated with the additional memory, and
the device is further configured to:
test, in a third mode of operation of the device, the additional memory via the third path, and
test, in a fourth mode of operation of the device, the additional memory via the fourth path.

7. The system according to claim 1, wherein the system is implemented in an application specific integrated circuit (ASIC), a programmable gate array (PGA), a microprocessor, a microcontroller, or any other type of digital processor.

8. The system according to claim 1, wherein at least a part of the system is implemented in a programmable hardware.

9. A device for memory self-test of a memory, the device comprising:
a first access port for testing, in a first mode of operation of the device, the memory via a first path between the first access port and the memory, the first path excluding error-correction code (ECC) logic associated with the memory, and
a second access port for testing, in a second mode of operation of the device, the memory via a second path between the second access port and the memory, the second path including the ECC logic associated with the memory, wherein the testing in the second mode comprises testing applied to both READ and WRITE operations.

10. The device according to claim 9, wherein:
the first access port is configured to communicate data structures of $n+p_n$ bits, and
the second access port is configured to communicate data structures of n bits, where n bits are configured to encode data to be stored in the memory, and $p_n$ bits are configured to encode one or more bits added to the data to be stored in the memory by the ECC logic associated with the memory.

11. The device according to claim 9, further comprising:
a controller configured to switch a mode of operation of the device between at least the first mode and the second mode.

12. The device according to claim 11, wherein the controller is configured to switch the mode of operation of the device in accordance with user input indicative of a desired mode of operation of the device.

13. The device according to claim 9, wherein the device is configured to:
communicate first address, control, and/or data signals between the first access port and the memory via the first path, and
communicate second address, control, and/or data signals between the second access port and the memory via the second path.

14. The device according to claim 9, further comprising:
a third access port for testing, in a third mode of operation of the device, an additional memory via a third path between the third access port and the additional memory, the third path excluding ECC logic associated with the additional memory, and
a fourth access port for testing, in a fourth mode of operation of the device, the additional memory via a fourth path between the fourth access port and the additional memory, the fourth path including the ECC logic associated with the additional memory.

15. A method for memory self-test of a memory using a device comprising a first access port and a second access port, the method comprising:
testing, in a first mode of operation of the device, the memory via a first path between the first access port and the memory, the first path excluding error-correction code (ECC) logic associated with the memory, and
testing, in a second mode of operation of the device, the memory via a second path between the second access port and the memory, the second path including the ECC logic associated with the memory, wherein the testing in the second mode comprises testing applied to both READ and WRITE operations.

16. The method according to claim 15, wherein:
the testing in the first mode of operation of the device comprises communicating data structures of $n+p_n$ bits via the first access port of the device, and
the testing in the second mode of operation of the device comprises communicating data structures of n bits via the second access port of the device,
where n bits are configured to encode data to be stored in the memory, and $p_n$ bits are configured to encode one or more bits added to the data to be stored in the memory by the ECC logic associated with the memory.

17. The method according to claim 15, further comprising:
switching a mode of operation of the device between at least the first mode and the second mode.

18. The method according to claim 17, wherein the switching comprises switching the mode of operation of the device in accordance with user input indicative of a desired mode of operation of the device.

19. The method according to claim 15, wherein:
the testing in the first mode of operation of the device comprises communicating first address, control, and/or data signals between the first access port and the memory via the first path, and
the testing in the second mode of operation of the device comprises communicating second address, control, and/or data signals between the second access port and the memory via the second path.

20. The method according to claim 15, wherein:
the system further comprises an additional memory and an ECC logic associated with the additional memory by being configured to correct or detect errors in reading and/or writing data to the additional memory by applying one or more ECC algorithms,
the device further comprises:
a third access port communicatively connected to the additional memory via a third path, the third path excluding the ECC logic associated with the additional memory, and
a fourth access port communicatively connected to the additional memory via a fourth path, the fourth path including the ECC logic associated with the additional memory, and
the device is further configured to:
test, in a third mode of operation of the device, the additional memory via the third path, and
test, in a fourth mode of operation of the device, the additional memory via the fourth path.

* * * * *